United States Patent [19]
Yoshio et al.

[11] Patent Number: 4,937,576
[45] Date of Patent: Jun. 26, 1990

[54] DITHER CIRCUIT RESPONSIVE TO ZERO INPUT SIGNAL LEVEL

[75] Inventors: Junichi Yoshio; Masami Suzuki; Masami Tsuchida; Kiyoshi Iwai, all of Saitama, Japan

[73] Assignee: Pioneer Electronic Corporation, Tokyo, Japan

[21] Appl. No.: 440,175

[22] Filed: Nov. 22, 1989

[30] Foreign Application Priority Data

Jun. 5, 1989 [JP] Japan .................................. 64/142793

[51] Int. Cl.⁵ .............................................. H03M 1/20
[52] U.S. Cl. .................................... 341/131; 341/126
[58] Field of Search ................ 341/126, 131, 144, 155, 341/139, 140

[56] References Cited

U.S. PATENT DOCUMENTS

| | | | |
|---|---|---|---|
| 4,183,016 | 1/1980 | Sawagata et al. | 341/131 |
| 4,751,496 | 6/1988 | Araki et al. | 341/131 |
| 4,845,498 | 7/1989 | Kubo et al. | 341/131 |
| 4,857,927 | 8/1989 | Takabayashi | 341/131 |

FOREIGN PATENT DOCUMENTS

| | | | |
|---|---|---|---|
| 62-11324 | 1/1987 | Japan | 341/131 |
| 63-67825 | 3/1988 | Japan | 341/131 |

Primary Examiner—William M. Shoop, Jr.
Assistant Examiner—Howard L. Williams
Attorney, Agent, or Firm—Sughrue, Mion, Zinn, Macpeak & Seas

[57] ABSTRACT

A dither circuit including an adder for receiving an input signal and a dither signal which is generated by a dither signal generator, a level detection circuit for detecting the signal level of the input signal, and a dither control circuit for stopping the feeding of the dither signal to the adder when the level detection circuit detects that the signal level of the input signal is zero.

11 Claims, 6 Drawing Sheets

4,937,576

DITHER CIRCUIT RESPONSIVE TO ZERO INPUT SIGNAL LEVEL

FIELD OF THE INVENTION

The present invention relates to a dither circuit and, more particularly, relates to a dither circuit suitable for information reproduction of a recording medium, such as an optical disc, having a digital signal as recording information.

BACKGROUND OF THE INVENTION

In a digital audio apparatus such as a CD player, a D/A conversion circuit is used for performing digital-to-analog conversion on a digital signal recorded on a recording medium such as a CD to perform audio reproduction.

In general, the D/A converter does not always have ideal conversion characteristic. In most cases, a conversion error arises and the conversion involves quantization noise. Such a noise component causes distortion of a reproduced signal. To avoid this disadvantage, a method of mixing a dither signal in a digital signal is known.

FIG. 11 shows an example of a conventionally known D/A conversion circuit using a dither generator. As shown in FIG. 11, a digital signal picked up from a recording medium is fed through a signal processing LSI 1 to a digital filter 2 by which the sampling rate or frequency $f_S$ is converted to be N times as high as $f_S$. Then the signal is converted into an analog signal by a D/A converter 4.

An adder 3 is disposed between the digital filter 2 and the D/A converter 4. Random M-series dither (noise) from a dither generator 7 is added to (or superimposed on) the digital signal by the adder 3 to attain whitening of quantization noise and suppression of a conversion error. Because the dither once added must be removed afterwards, the D/A converter 4 is followed by a subtracter 5 by which the dither supplied from the dither generator 7 is subtracted (or removed) after digital-to-analog conversion by another D/A converter 8. The analog signal thus purified is sent out through an analog low-pass filter 6. The analog low-pass filter 6 serves to cut the signal component of over-sampling frequency $Nf_S$ when the sampling frequency $f_S$ is made high by a factor N (over-sampling).

In the above-mentioned conventional D/A conversion circuit, generally, the D/A converter 4 does not operate when it does not receive a signal. Accordingly, the converter 4 does not produce noise pertaining to its switching operation. Accordingly, the converter 4 has a good S/N characteristic. However, the dither signal of a constant level is always fed from the dither generator 7 to the adder even if the converter 4 does not receive an input signal (hereinafter referred to as "non-input-signal time"). Consequently, the mixed dither signal unnecessarily forces switching operation on the D/A converter 4 so that noise pertaining to the switching operation is produced to deteriorate S/N in the non-input-signal time. To eliminate this disadvantage, a method of limiting the non-input-signal-time noise only to quantization noise is known (Japanese Patent Postexamination Publication No. 62-21420).

The known method can limit noise but cannot perfectly eliminate the influence of the dither signal because the non-input-signal-time noise still exists.

The aforementioned problem arises in an A/D conversion circuit as well as the D/A conversion circuit. In short, the problem caused by influence of the dither signal in the non-input-signal time cannot be neglected as well as the problem caused by quantization error.

SUMMARY OF THE INVENTION

Therefore, an object of the present invention is to provide a dither circuit in which generation of noise caused by the dither signal in the non-input-signal time can be prevented perfectly to attain a good S/N characteristic.

In order to solve the aforementioned problems, according to a first aspect of the present invention, the dither circuit comprises an adder for mixing a dither signal into an input signal, a dither generator for generating a dither signal to be fed to the adder, a level detection circuit for detecting the signal level of the input signal, and a dither control circuit for stopping the feeding of the dither signal to the adder when the signal level of the input signal is zero.

According to a second aspect of the present invention, the dither circuit comprises a digital filter for removing digital noise in a digital signal sampled by a predetermined sampling frequency, an adder for mixing a dither signal into the output signal of the digital filter, a dither generator for generating a dither signal to be fed to the adder, a D/A converter for converting the output signal of the adder into an analog signal, a level detection circuit for detecting the signal level of the output signal of the digital filter, and a dither control circuit for stopping the feeding of the dither signal to the adder when the signal level is zero.

According to a third aspect of the present invention, the dither circuit comprises an adder for mixing a dither signal into an analog input signal, a dither generator for generating a dither signal to be fed to the adder, an A/D converter for converting the output signal of the adder into a digital signal, a level detection circuit for detecting the signal level of the analog input signal, and a dither control circuit for stopping the feeding of the dither signal to the adder when the signal level of the analog input signal is zero.

In the dither circuit according to the first aspect of the present invention, the level detection circuit detects the signal level of the input signal. When the signal level of the input signal is zero (that is, in the non-input-signal time), the dither control circuit stops the feeding of the dither signal into the adder. Consequently, the dither signal is not mixed in the non-input-signal time, and, accordingly, quantization noise caused by the dither signal is not mixed, so that generation of noise pertaining to the dither signal can be prevented.

In the dither circuit according to the second aspect of the present invention, the level detection circuit detects the signal level of the output signal of the digital filter. When the signal level is zero, the dither control circuit stops the feeding of the dither signal to the adder. Consequently, the dither signal is not mixed in the non-input-signal time, and, accordingly, quantization noise caused by the dither signal is not mixed. Further, the D/A converter becomes free from unnecessary switching operation, so that generation of noise pertaining to the dither signal can be prevented.

In the dither circuit according to the third aspect of the present invention, the level detection circuit detects the signal level of the analog input signal. When the signal level of the input signal is zero, the dither control circuit stops the feeding of the dither signal to the adder. Consequently, the dither signal is not mixed in the non-input-signal time, and, accordingly, quantization noise caused by the dither signal is not mixed, so that generation of noise pertaining to the dither signal can be prevented.

DETAILED DESCRIPTION OF THE PREFERRED EMBODIMENTS

The present invention as to preferred embodiments thereof will be described with reference to the accompanying drawings.

Figure 1:
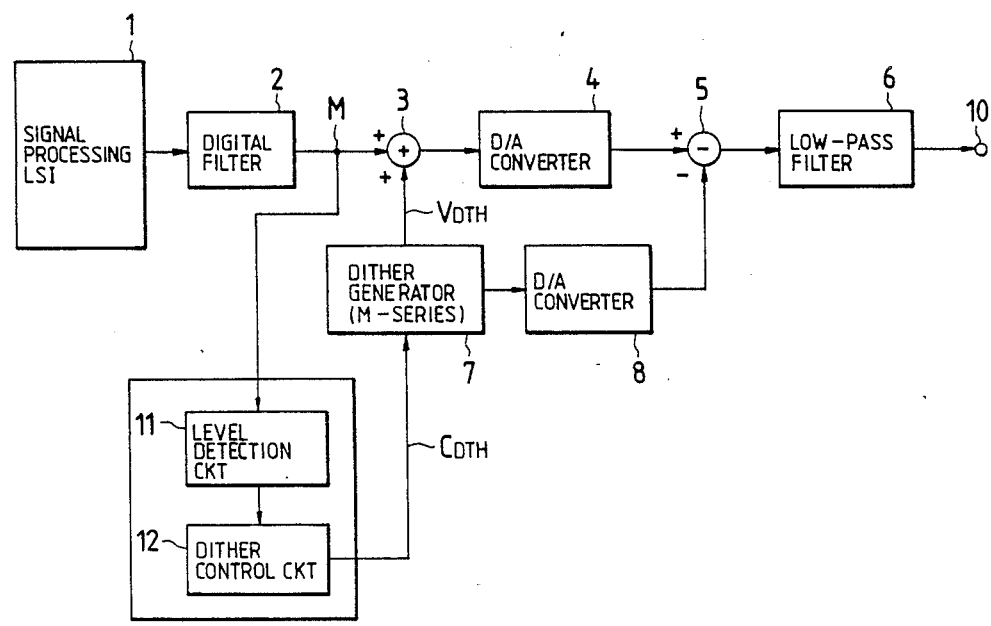
FIG. 1 is a block diagram of a first embodiment of the present invention.
Figure 11:
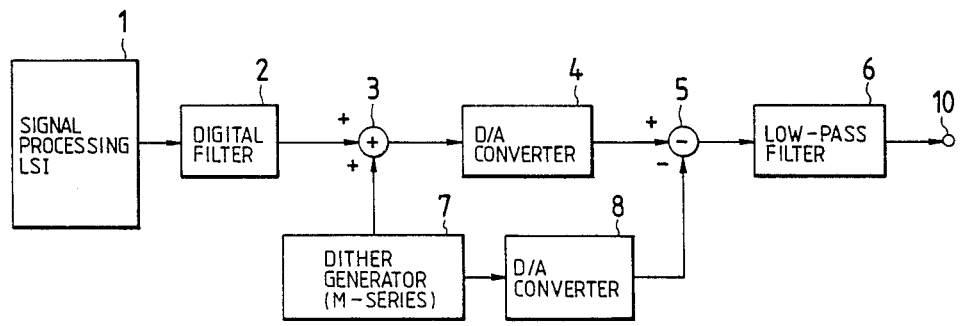
FIG. 11 is a block diagram of a conventional A/D conversion circuit.

A first embodiment of the present invention is illustrated in FIG. 1 in which items the same as or equivalent to those in FIG. 11 are referenced correspondingly.

The difference of the embodiment shown in FIG. 1 from the prior art shown in FIG. 11 is in that in the former there is provided a level detection circuit 11 for detecting the signal level of the input signal and a dither control circuit 12 for stopping the feeding of the dither signal to the adder to prevent generation of the dither signal when the signal level of the input signal is zero.

In the following the operation of the dither circuit is described.

Figure 2:
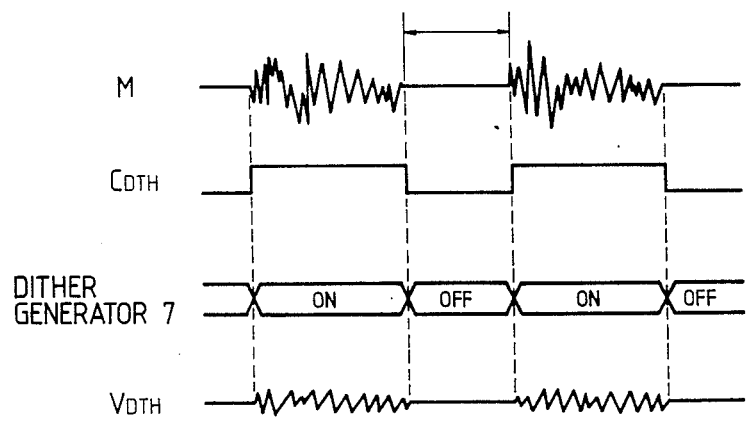
FIG. 2 is a view of wave forms showing the operation of various parts of the first embodiment.

In a state where the output signal of the digital filter 2, such as for example a music signal M as shown in FIG. 2, is being supplied, the level of a dither control signal $C_{DTH}$ generated from the dither control circuit 12 becomes high so that the dither generator 7 generates a dither signal $V_{DTH}$ to the adder 3.

When the music signal M is lost or in other words when no signal is given, the level of the dither control signal $C_{DTH}$ becomes low so that the dither generator 7 is turned off to stop the generation of the dither signal $V_{DTH}$. As a result, neither signal (or noise) from the digital filter 2 nor signal (or noise) from the dither generator 7 is fed to the adder 3. Accordingly, the D/A converter 4 does not operate. Consequently, the influence of the dither signal $V_{DTH}$ can be eliminated perfectly, so that S/N at the output terminal 10 becomes high.

Figure 3:
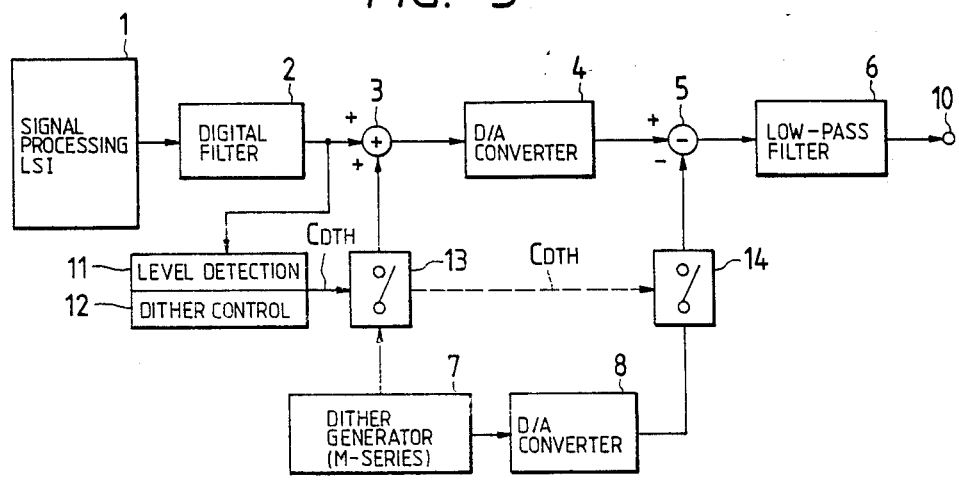
FIG. 3 is a block diagram of a second embodiment of the present invention.

A second embodiment of the present invention is illustrated in FIG. 3.

In the second embodiment, switching means 13 and 14 for performing ON/OFF operation based on the dither control signal $C_{DTH}$ are disposed between the adder 3 and the dither generator 7 and between the subtractor 5 and the D/A converter 8 to control the transmission of the dither signal $V_{DTH}$ from the dither generator 7 without switching on and off the operation of the dither generator 7 unlike the first embodiment of FIG. 1. Accordingly, in this embodiment, the dither generator 7 always generates the dither signal $V_{DTH}$.

According to this embodiment, there is no necessity that the dither generator 7 must be started or stopped in such a manner as in the first embodiment whenever the present and absence of the music signal M are switcher over. Consequently, the dither signal $V_{DTH}$ rises smoothly when mixed.

Figure 4:
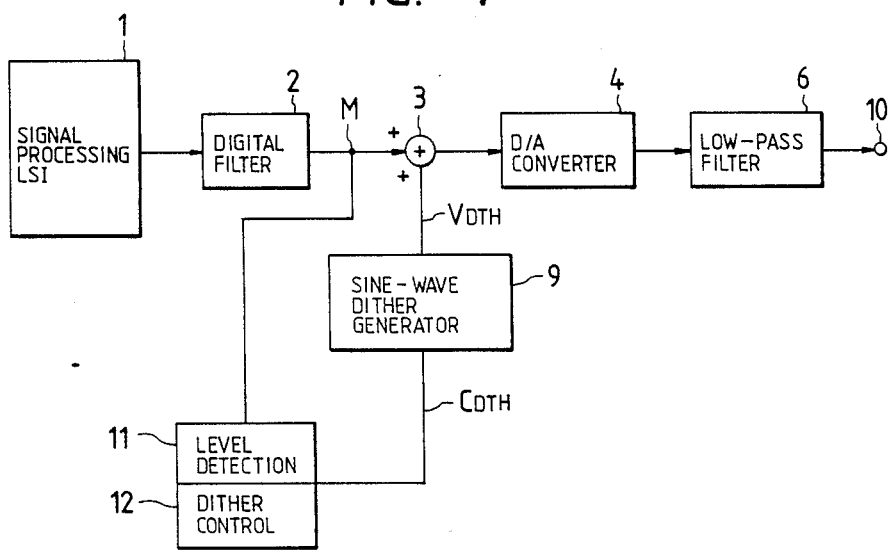
FIG. 4 is a block diagram of a third embodiment of the present invention.

A third embodiment of the present invention is illustrated in FIG. 4.

This embodiment makes an improvement in that both the conventional digital-to-analog conversion circuit of FIG. 11 and the first embodiment of FIG. 1 require the D/A converter 8 provided for removing dither in addition to the original D/A converter 4 for converting a digital signal into an analog signal. That is to say, in order to provide a digital-to-analog conversion circuit capable of removing dither perfectly and reproducing the original signal correctly with a simple configuration, the present invention has been applied to a digital-to-analog conversion circuit in which a sine-wave dither generator 9 is provided as a dither generator without providing such subtracter 5 and D/A converter 8 as used in the embodiment of FIG. 1 and in the prior art of FIG. 11.

Use of the D/A converter 8 in addition to the D/A converter 4 as illustrated in the embodiment of FIG. 1 and in the prior art of FIG. 11 imposes both large size and complex construction on the D/A conversion circuit. In particular, when there is a difference in conversion characteristics between the D/A converters 4 and 8, the dither cannot be removed perfectly so that a signal containing noise may be reproduced. In this embodiment, this point has been improved.

In FIG. 4, the digital signal from the signal processing LSI 1 is fed to the digital filter 2.

Figure 5:
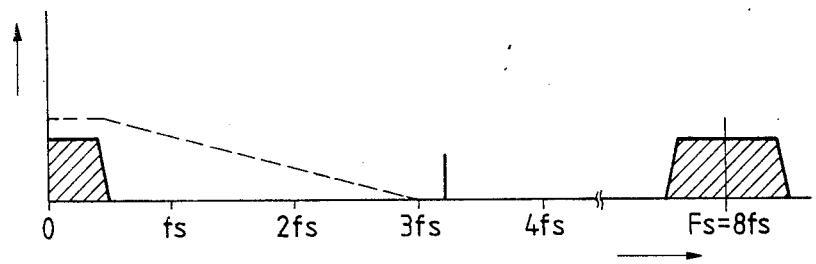
FIG. 5 is a diagram for explaining over-sampling.

The digital filter 2 shifts noise contained in the digital signal, such as return noise and quantization noise, out of audio frequency range by oversampling with a sampling rate N times as high as a normal sampling rate and then feeds the output thereof to the adder 3. On the other hand, the output signal of the digital filter 2 is fed to the level detection circuit 11. FIG. 5 is a frequency spectrum diagram in the case of over-sampling. FIG. 5 shows the case where over-sampling frequency $F_S$ which is eight times (N=8) as high as the normal sampling frequency $f_S$.

On the other hand, a sine-wave dither signal from the sine-wave dither generator 9 is fed to the adder 3. The sine-wave dither signal is provided with a frequency such as $3.2f_S$ ($=0.4F_S$) as shown in FIG. 5. It can be understood from FIG. 5 that the dither frequency is selected so as to be out of the audio frequency range and so as to fall within a range of from $\frac{1}{2} f_S$ for $\frac{1}{2} Nf_S$ in order to prevent the influence of return noise. It is, however, difficult to prepare a low-pass filter having an attenuation characteristic sharp in cut-off frequency $\frac{1}{2} f_S$. It is therefore practically preferable to select a frequency which is out of the audio frequency range and as near $\frac{1}{2} Nf_S$ as possible to use a low-pass filter having a relatively slow attenuation curve. The sine-wave dither signal having such a characteristic is added to the output of the digital filter 2 by the adder 3.

In the case where the output signal of the digital filter 2 is absent, however, a dither control signal $C_{DTH}$ is generated from the dither control circuit 12 and fed to the sine-wave dither generator 9 based on the detection signal of the level detection circuit 11 so that the sine-wave dither generator 9 stops feeding of the dither signal $V_{DTH}$ to the adder 3 as shown in FIG. 2. Accordingly, the dither signal $V_{DTH}$ does not exert any influence on the D/A converter 4 when the output signal of the digital filter 2 is absent.

After addition, the digital signal which is in a state where the dither signal is combined with the digital signal from the digital filter 2, is fed to the D/A converter 4.

In the D/A converter 4, the composite digital signal thus received is converted into an analog signal. As to the D/A converter, the circuit configuration thereof is regardless. At the time of conversion, the digital signal to be subjected to conversion contains the sine-wave dither signal so that conversion error is not generated at a fixed point but is dispersed and averaged to reduce conversion error as a whole.

The analog signal thus subjected to conversion is fed to the low-pass filter in which high-range noise as an unnecessary component is removed, so that the original wave form is sent out from the output terminal 10. Because the low-pass filter has such a characteristic as shown in FIG. 5 and the sine-wave dither signal is selected to $3.2f_S$, the sine-wave dither signal contained in the output analog signal of the D/A converter 4 is removed by the low-pass filter. Accordingly, the dither signal subjected to addition in the same manner as in the prior art can be removed easily without subtraction. Accordingly, the D/A converter 8 and the subtracter 5 as shown in FIG. 11 can be omitted.

As described above, according to this embodiment, D/A conversion can be made correctly by a simple operation of adding the sine-wave dither signal selected to a suitable frequency. Further, subtraction of the dither signal can be made easily by the low-pass filter. Accordingly, the circuit configuration can be so simplified as to be advantageous in characteristic and cost. Further, the frequency of the sine-wave dither signal is variable. Accordingly, it is necessary only to adjust the frequency of the sine-wave dither signal in accordance with the attenuation curve of the low-pass filter without the necessity of using a special low-pass filter having a sharp attenuation characteristic, so that it is possible to perform simplification of configuration of the low-pass filter and minimization of the total circuit. In addition, deterioration of S/N caused by the dither signal $V_{DTH}$ in the non-input signal time can be presented.

Figure 6:
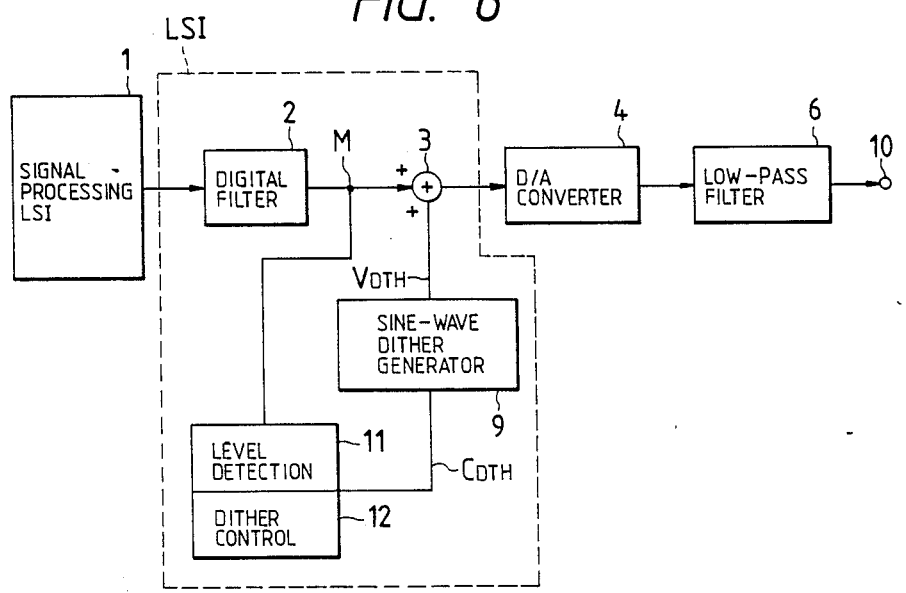
FIG. 6 is a block diagram for explaining a fourth embodiment of the present invention.

A fourth embodiment of the present invention is illustrated in FIG. 6. This embodiment is configured so that the digital filter 2, the adder 3 and the sine-wave dither generator 9 are incorporated in an LSI as one chip. By incorporating parts in one LSI, the dither circuit can be generalized to make it easy to be applied to an existing D/A conversion circuit to improve same. By making the dither frequency of the sine-wave dither generator 9 adjustable, the sine-wave dither generator 9 can be used in any D/A conversion circuit to increase the degree of freedom for use thereof.

Although the aforementioned embodiments have shown the case where the dither signal is formed of sine-wave noise, the same effect can be attained in the case where the dither signal is formed of triangular-wave noise. In short, any signal can be used so long as the signal can be expressed by a periodic function.

Although the embodiments have shown the case where a mere analog low-pass filter is used for subtraction of the dither signal, it is a matter of course that any filter can be used so long as the filter can pass signals within the audio band but attenuate the dither signal.

Figure 7:
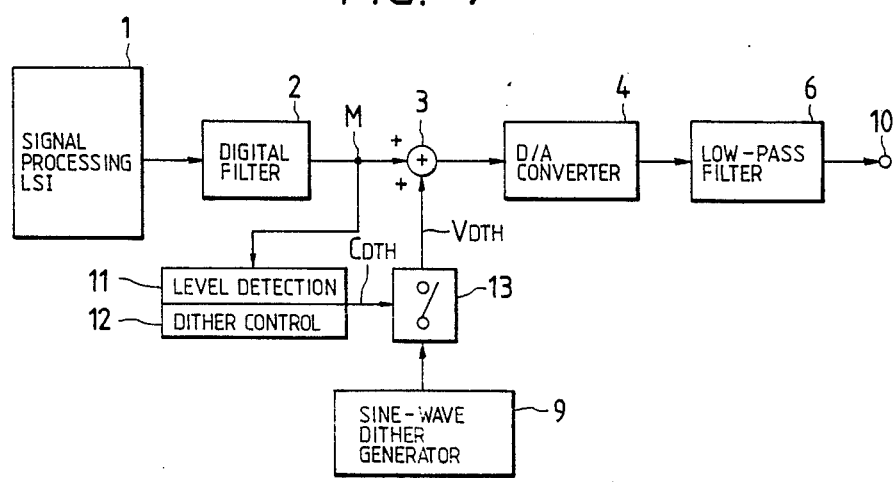
FIG. 7 is a block diagram for explaining a fifth embodiment of the present invention.

A fifth embodiment of the present invention is illustrated in FIG. 7.

In the fifth embodiment, a switching means 13 for performing ON/OFF operation based on the dither control signal $C_{DTH}$ is disposed between the sine-wave dither generator 9 and the adder 3 in the same manner as in the second embodiment (FIG. 3) to control the transmission of the dither signal $V_{DTH}$ without the ON/OFF operation of the sine-wave dither generator 9. The remaining configuration of FIG. 7 is the same as that in FIG. 4.

Figure 8:
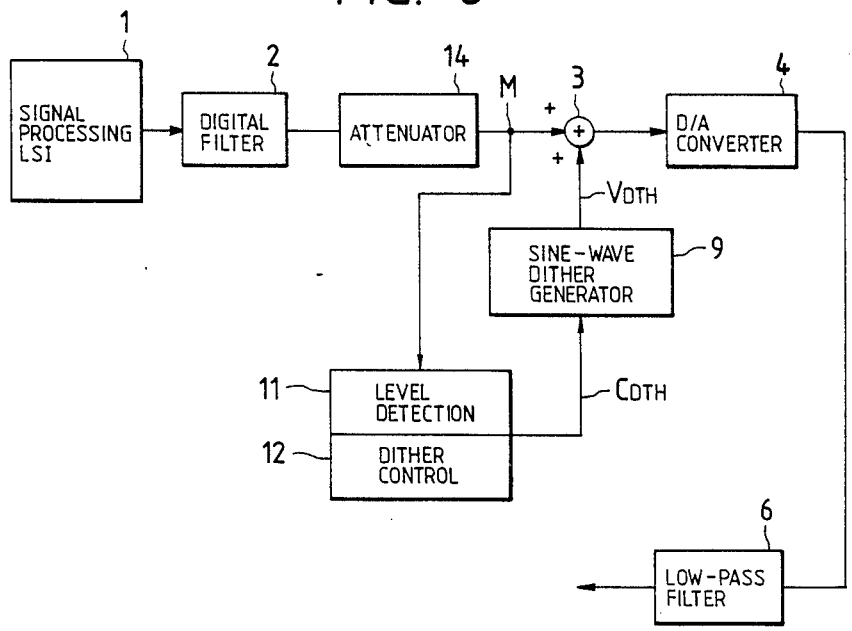
FIG. 8 is a block diagram for explaining a sixth embodiment of the present invention.

A sixth embodiment of the present invention is illustrated in FIG. 8.

In the sixth embodiment, the present invention is applied to a digital-to-analog conversion circuit using an attenuator as a countermeasure to overflow of the input digital signal.

Figure 9A:
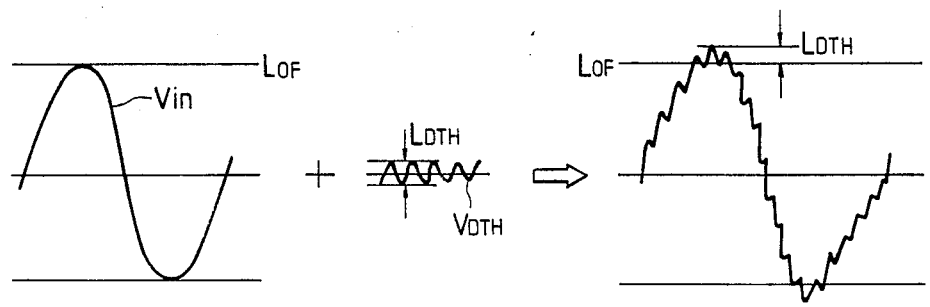
FIG. 9 is a diagram for explaining overflow.

In the case of using the dither method, a problem arises in that when the input digital signal overflows, the input signal exceeds the head room of the reproduction system corresponding to the added dither signal. Specifically, when a dither signal $V_{DTH}$ is added to an input signal $V_{in}$ which is in an overflow level $L_{OF}$ as shown in FIG. 9(a), the signal obtained by addition overflows by the level (dither level) $L_{DTH}$ of the dither signal $V_{DTH}$. In this embodiment, the present invention is applied to a configuration in which an attenuator 14 is disposed between the digital filter 2 and the adder 3 to provide a digital-to-analog conversion circuit having a dither generator which is simple in configuration and free from wave form distortion at the time of overflow.

Figure 9B:
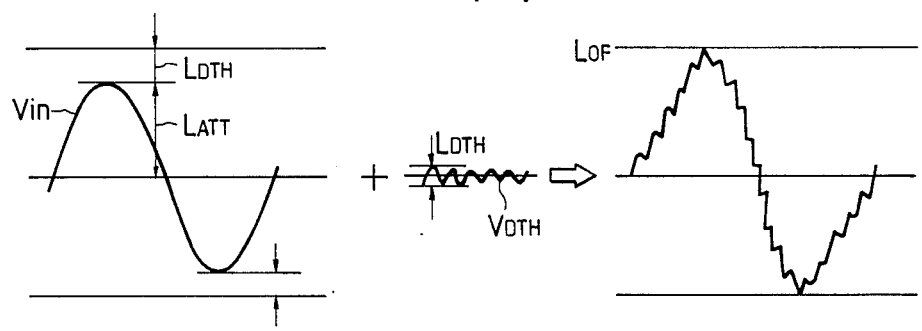

That is to say, the attenuator 14 changes the level of the input signal $V_{in}$ obtained from the digital filter 2 into an attenuation level $L_{ATT}$ reduced by the dither level $L_{DTH}$ as shown in FIG. 9(b). As a result, overflow does not occur in the input signal of the D/A converter 4 even though the dither signal $V_{DTH}$ from the dither generator 7 is added in the adder 3. Because this attenuation is applied to the total input signal $V_{in}$, that is, because the signal is not clipped locally, there is no occurrence of wave form distortion of the signal.

In this embodiment, the output of the dither signal $V_{DTH}$ from the sine-wave dither generator 9 in the non-input-signal time is prevented by the level detection circuit 11. Accordingly, influence of the dither signal $V_{DTH}$ in the non-input-signal time can be eliminated, so that S/N can be improved.

Figure 10:
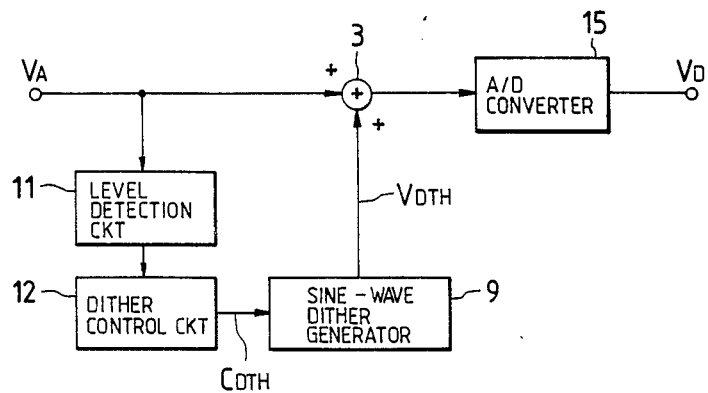
FIG. 10 is a diagram for explaining a seventh embodiment of the present invention.

A seventh embodiment of the present invention is illustrated in FIG. 10. This embodiment shows the case where the present invention is applied to an A/D conversion circuit.

In FIG. 10, when an analog input signal $V_A$ is received, a dither signal $V_{DTH}$ from the sine-wave dither generator 9 is mixed into the analog input signal $V_A$ by the adder 3. The mixed signal is converted into a digital quantity by the A/D converter 15 so as to be sent out as a digital output signal $V_D$. Then, for example, the analog input signal $V_A$ now changes to zero in level (non-input-signal time), this state is detected by the level detection circuit 11. A control signal $C_{DTH}$ is fed to the dither control circuit based on the detection signal of the circuit 11 to stop the output of the dither signal $V_{DTH}$ from the sine-wave dither generator 9. Because the dither signal $V_{DTH}$ is not mixed into the input signal in the non-input signal time, occurrence of unnecessary noise can be prevented, so that S/N can be improved.

It is a matter of course that the use of the A/D converter is not limited to this embodiment and the present invention can be applied to the case where the D/A converter 4 as shown in FIGS. 1, 3-4 and 6-8 is replaced by an A/D converter.

As described above, according to the present invention, the mixing of the dither signal is prevented in the non-input-signal time, so that the unnecessary switching operation of the D/A converter can be avoided to eliminate perfectly the influence of the dither signal on S/N.

What is claimed is:

1. A dither circuit comprising:
   a dither generator for generating a dither signal;
   an adder for mixing said dither signal into an input signal and providing an adder output signal;
   a level detection circuit for detecting the signal level of said input signal; and
   a dither control circuit for stopping the feeding of said dither signal to said adder when the signal level of said input signal is zero.

2. The dither circuit as defined in claim 1, further comprising a first D/A converter for converting said adder output signal of said adder to a first analog signal, a second D/A converter for converting said dither signal of said dither generator to a second analog signal, and a subtractor for subtracting said second analog signal from said first analog signal.

3. The dither circuit as defined in claim 1, wherein said dither control circuit includes means for generating a control signal which disables said dither generator when the signal level of said input signal is zero.

4. A dither circuit comprising:
   a digital filter for removing digital noise in a digital signal sampled at a predetermined sampling frequency and providing a filter output signal;
   a dither generator for generating a dither signal;
   an adder for mixing said dither signal into said filter output signal of said digital filter and providing an adder output signal;
   a D/A converter for converting said adder output signal of said adder into an analog signal;
   a level detection circuit for detecting the signal level of said filter output signal of said digital filter; and
   a dither control circuit for stopping the feeding of said dither signal to said adder when said filter output signal level is zero.

5. The dither circuit as defined in claim 4, further comprising switching means coupled between an input of said adder and said dither generator, said switching means switching between a closed state for allowing said dither signal of said dither generator to be fed to said adder and an open state for preventing said dither signal of said dither generator to be fed to said adder.

6. The dither circuit as defined in claim 5, wherein said dither control circuit generates a control signal, and wherein said switching means switches between said open and closed states in accordance with said control signal.

7. The dither circuit as defined in claim 4, wherein said dither generator is a sine-wave dither generator.

8. The dither circuit as defined in claim 4, wherein said digital filter, adder, dither generator, level detection circuit and said dither control circuit together constitute a large scale integration circuit.

9. A dither circuit comprising:
   a dither generator for generating a dither signal;
   an adder for mixing said dither signal into an analog input signal;
   an A/D converter for converting said adder output signal of said adder into a digital signal;
   a level detection circuit for detecting the signal level of said analog input signal; and
   a dither control circuit for stopping the feeding of said dither signal to said adder then the signal level of said analog input signal is zero.

10. A dither circuit comprising:
    a digital filter for removing digital noise in a digital signal sampled at a predetermine sampling frequency and providing a filter output signal;
    an attenuator for attenuating said filter output of said digital filter and providing an attenuator output signal;
    a dither generator for generating a dither signal;
    an adder for mixing said dither signal into said attenuator output signal of said attenuator;
    a level detection circuit for detecting the signal level of said attenuator output signal of said attenuator; and
    a dither control circuit for stopping the feeding of said dither signal to said adder when said signal level is zero.

11. The dither control circuit as defined in claim 10, further comprising a D/A converter for converting said adder output signal of said adder into an analog signal.

* * * * *